United States Patent
Ogasawara

[19]

[11] Patent Number: 6,052,077
[45] Date of Patent: Apr. 18, 2000

[54] DEVICE FOR BINARY-CODING A READ SIGNAL FROM A MAGNETIC TAPE

[75] Inventor: Susumu Ogasawara, Tokyo, Japan

[73] Assignee: NEC Corporation, Tokyo, Japan

[21] Appl. No.: 08/921,351

[22] Filed: Aug. 29, 1997

[30] Foreign Application Priority Data

Aug. 29, 1996 [JP] Japan ................................. 8-228174

[51] Int. Cl.⁷ .............................. H03M 1/38; G11B 5/00
[52] U.S. Cl. .............................................. 341/161; 360/32
[58] Field of Search .................................. 341/58, 59, 64, 341/161; 360/32, 53; 369/59, 60

[56] References Cited

U.S. PATENT DOCUMENTS

| | | | |
|---|---|---|---|
| 4,626,933 | 12/1986 | Bucska et al. | 360/51 |
| 5,321,679 | 6/1994 | Horiguchi | 369/54 |
| 5,384,790 | 1/1995 | Tollum | 371/40.1 |

FOREIGN PATENT DOCUMENTS 2-244409  9/1990  Japan .

Primary Examiner—Michael Tokar
Assistant Examiner—Peguy JeanPierre
Attorney, Agent, or Firm—Foley & Lardner

[57] ABSTRACT

A device for binary-coding a read signal from a magnetic tape is capable of reading correct digital data by setting an optimum threshold voltage of a comparator which digitalizes an analog read signal. The device includes a binary-coding section 10 which outputs a value "1" when the analog read signal exceeds a predetermined reference threshold voltage, and outputs a value "0" when the analog read signal does not exceed the threshold voltage, and a threshold voltage setting section 20 which increases or decreases the threshold voltage of the binary-coding section 10 by a predetermined amount with respect to a predetermined reference voltage when a record density ID of the magnetic tape is incorrectly binary-coded by the binary-coding section 10.

5 Claims, 5 Drawing Sheets

1 0 0 0 0 0 1

0 0 0 0 0 0 1

1 1 0 0 0 0 1

0 0 0 0 0 1 1

DEVICE FOR BINARY-CODING A READ SIGNAL FROM A MAGNETIC TAPE

BACKGROUND OF THE INVENTION

1. Field of the Invention

The present invention relates to a device for binary-coding a read signal from a magnetic tape, and more particularly to a device for binary-coding a read signal from a magnetic tape, which is suitable for a half inch cartridge magnetic tape drive (hereinafter referred to as "½ CGMT device").

2. Description of the Related Art

Up to now, in the ½ CGMT device, a waveform read from a magnetic tape where data has been recorded through the NRZI rule (non return to zero in-change rule) is differentiated and read. A position of data "1" represented by the read waveform is a positive or negative peak of the read waveform, and the magnetic defect on a medium and an electric external noise cause the read waveform to be undesirably changed. In other words, they cause the insertion of false data which is called "drop-in" and the deletion of data which is called "drop-out" to be generated.

For the above reason, a digital data read circuit is structured such that, in order to set a condition where the amplitude of the analog read signal is a given level or more in detection of data "1", an absolute value of the amplitude of the read waveform is detected, a peak of a given threshold voltage is detected, and the detected peak is set to data "1".

However, in the above conventional example, a difference in read waveform is caused depending on the respective read heads and magnetic tape medium because the characteristic of the read heads and the characteristic of the magnetic tape medium are dispersed. Therefore, in case of an analog read waveform shown in FIG. 5a, there was a case where error digital data shown in FIG. 5c might be read without reading correct digital data shown in FIG. 5b. The reason is because the threshold voltage is fixed.

SUMMARY OF THE INVENTION

The present invention has been made to improve the inconveniences with the above conventional example, and an object of the present invention is to provide a device for binary-coding a read signal from a magnetic tape, in particular, which is capable of reading correct digital data by setting a threshold voltage of a comparator that binary-codes an analog read signal to an optimum value.

To achieve the above object, according to the present invention, there is provided a device for binary-coding a read signal from a magnetic tape, which comprises: a binary-coding section which outputs a value "1" when an analog read signal exceeds a predetermined threshold voltage, and outputs a value "0" when the analog read signal does not exceed the predetermined threshold voltage; and a threshold voltage setting section which increases or decreases the threshold voltage of the binary-coding section by a predetermined amount with respect to a reference voltage when a record density ID recorded in a head of the magnetic tape is incorrectly binary-coded by the binary-coding section.

In another embodiment of the device the present invention, the threshold voltage setting section increases the threshold voltage of the binary-coding section by the predetermined amount with respect to the reference voltage when the magnetic recording density ID binary-coded by the binary-coding section is incorrect because the number of bits of the value "1" is large, and decreases the threshold voltage of the binary-coding section by the predetermined amount with respect to the reference voltage when the magnetic recording density ID binary-coded by the binary-coding section is incorrect because the number of bits of the value "0" is large.

In the device for binary-coding a read signal from a magnetic tape according to the present invention, the predetermined amount is a given value regardless of the threshold voltage.

In a further embodiment of the present invention, the threshold voltage setting section comprises: a parallel-output type shift register for storing the recording density ID of the magnetic tape which has been binary-coded by the binary-coding section; and a nonvolatile memory for setting a corresponding threshold voltage value to the binary-coding section according to an output of the shift register.

In yet another embodiment of the present invention, the binary-coding section comprises: a first comparator having a positive input to which the analog read signal is supplied; a second comparator having a negative input to which the analog read signal is supplied; and an OR circuit which inputs an output of the first comparator and an output of the second comparator to output a signal to the threshold voltage setting section.

In a still further embodiment of the present invention, the threshold voltage setting section comprises: a parallel-output type shift register for storing the recording density ID of the magnetic tape which has been binary-coded by the binary-coding section; a nonvolatile memory for storing a digital output corresponding to a threshold voltage value according to an output of the shift register; a D/A converter for converting the digital output into an analog value; an inverse amplifier having a negative input to which an output of the D/A converter is connected and a positive input which is grounded; and an amplifier having a positive input to which an output of the D/A converter is connected and a negative input which is grounded; wherein an output of the inverse amplifier is connected to a positive input of the second comparator, and an output of the amplifier is connected to a negative input of the first comparator.

BRIEF DESCRIPTION OF THE DRAWINGS

The novel features believed characteristic of the invention are set forth in the appended claims. The invention itself, however, as well as other features and advantages thereof, will be best understood by reference to the detailed description which follows, read in conjunction with the accompanying drawings, wherein:

FIGS. 2a to 2d are signal diagrams for explaining the operation of a binary-coding section, wherein FIG. 2a shows an analog read signal which is inputted to the binary-coding section, FIG. 2b shows an output signal of a first comparator, FIG. 2c shows an output signal of a second comparator, and FIG. 2d shows an output signal of an OR circuit;

FIGS. 3a and 3b are signal diagrams for explaining the setting operation of a threshold voltage, wherein FIG. 3a shows an analog read signal, and FIG. 3b shows an output signal of the OR circuit;

FIGS. 4a and 4b are signal diagrams for explaining the setting operation of the threshold voltage, wherein FIG. 4a shows an analog read signal, and FIG. 4b shows an output signal of the OR circuit;

FIGS. 6a to 6d are diagrams showing relations between a waveform, a threshold value and a value of a shift register 7 when discriminating a tone pattern, wherein FIG. 6a is a case in which discrimination is performed without any errors, FIG. 6b is a case in which a threshold voltage 31 is too large, and FIGS. 6c and 6d are cases in which the threshold voltage 31 is too small.

DETAILED DESCRIPTION OF THE PREFERRED EMBODIMENTS

Hereinafter, a description will be given in more details of an embodiment of the present invention with reference to FIGS. 1 to 4.

Figure 1:
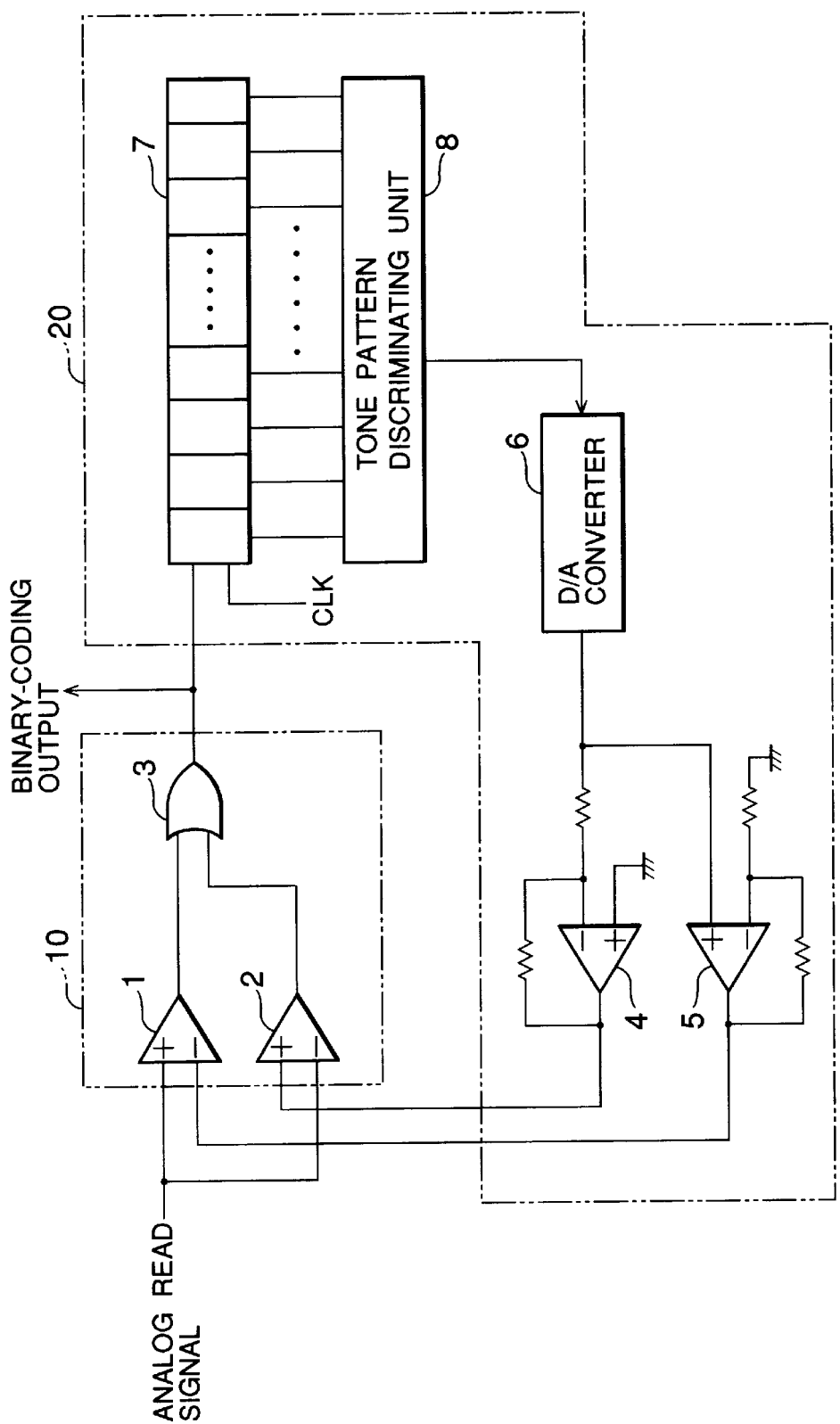
FIG. 1 is a block diagram showing one embodiment of the present invention.

A read signal binary-coding device shown in FIG. 1 includes a binary-coding section 10 which outputs a value "1" when an analog read signal exceeds a predetermined threshold voltage and outputs a value "0" when the analog read signal does not exceed the predetermined threshold voltage, and a threshold voltage setting section 20 which increases or decreases the threshold voltage of the binary-coding section by a predetermined amount with respect to a reference voltage when a recording density ID of a magnetic tape is incorrectly binary-coded by the binary-coding section.

In this embodiment, the threshold voltage setting section 20 increases the threshold voltage of the binary-coding section by the predetermined amount with respect to the reference voltage when the magnetic recording density ID of the magnetic tape which is binary-coded by the binary-coding section 10 is incorrect because the number of bits of the value "1" is large, and decreases the threshold voltage of the binary-coding section by the predetermined amount with respect to the reference voltage when the magnetic recording density ID is incorrect because the number of bits of the value "0" is large.

Giving a description in more detail, in this embodiment, the binary-coding section 10 includes a first comparator 1 which inputs the analog read signal at its positive input and inputs the threshold voltage at its negative input, a second comparator 2 which inputs the analog read signal at its negative input and inputs the threshold voltage at its positive input, and an OR circuit which adds an output signal of the first comparator 1 and an output signal of the second comparator 2.

On the other hand, the threshold voltage setting section 20 includes a series-input parallel-output type shift register 7 which sequentially inputs an output signal of the OR circuit 3 in synchronism with a clock signal, a tone pattern discriminating unit 8 which obtains a data train (tone pattern) stored in the shift register 7 at a predetermined timing to output a threshold voltage value corresponding to the data train as a digital signal, and a D/A converter 6 which converts an output signal of the tone pattern discriminating unit 8 into a voltage. The threshold voltage setting section 20 also includes an inverse amplifier 4 which inputs an output signal of the D/A converter 6 at its negative input and whose positive input is grounded, and an amplifier 5 which inputs the output signal of the D/A comparator 6 at its positive input and whose negative input is grounded. The output of the inverse amplifier 4 is connected to the positive input of the second comparator 2. Also, the output of the amplifier 5 is connected to the negative input of the first comparator 1.

In this example, the recording density ID of the magnetic tape is generally comprised of the repetition (100000100000100 . . . ) of a 6-bit pattern "100000". Also, in this embodiment, the shift register 7 is made up of a 7-bit register, and in the case where the recording density ID is correctly binary-coded, "1000001" is stored at a predetermined timing. The tone pattern discriminating unit 8 is made up of a ROM, and when the least significant bit of the shift register (a bit which is first stored) becomes "1", a predetermined threshold voltage value which is recorded in advance is outputted from an address identified by more significant 6 bits of the shift register. In the ROM, the reference threshold voltage value is stored at an address "100000", and also a threshold voltage value slightly larger than the reference threshold voltage value is stored at an address larger than "100000", whereas a threshold voltage value slightly smaller than the reference threshold voltage value is stored at an address smaller than "100000".

Then, the entire operation of the binary-coding device according to this embodiment will be described with reference to FIGS. 2 to 7.

Figure 2A:
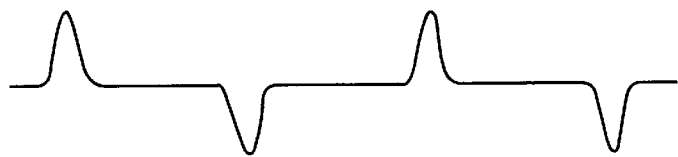
Figure 2B:
Figure 2C:
Figure 2D:

When an analog read signal of a record density ID shown in FIG. 2a is inputted to the first comparator and the second comparator, if a predetermined threshold voltage is appropriate, then a binary-coded signal (100000000000100000 . . . ) shown in FIG. 2b is outputted from the first comparator 1, and a binary-coded signal (000000100000000000100 . . . ) shown in FIG. 2c is outputted from the second comparator 2. Hence, a binary-coded signal (100000100000100000100 . . . ) shown in FIG. 2d is outputted from the OR circuit 3 so that it is sequentially stored in the shift register 7 at a clock timing coincident with a data period of the read signal. First, when all of 7 bits in the shift register are filled up, "1000001" is then stored.

The tone pattern discriminating unit 8 obtains the output (100000) of the more significant 6 bits provided that the least significant bit of the shift register 7 becomes "1", to output the reference threshold voltage value stored at the address "100000". An output signal of the tone pattern discriminating unit 8 after being converted into a voltage through the D/A converter, sets the reference threshold voltage to the first comparator 1 and the second comparator 2 through the inverse amplifier 4 and the amplifier 5. In other words, if the threshold voltage of the binary-coding section 10 has been set to the reference threshold voltage in advance, no threshold voltage is changed.

Figure 3A:
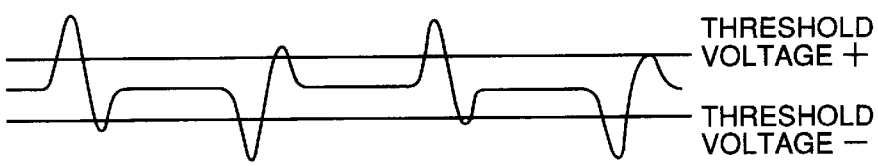
Figure 3B:

On the other hand, when a record signal of the record density ID shown in FIG. 3a is inputted to the first comparator 1 and the second comparator 2, a binary-coded signal (1100001100001100 . . . ) shown in FIG. 3b is outputted from the OR circuit 3 in relation to the reference threshold voltage shown in FIG. 3a. Therefore, "1000011" is first stored in the respective bits of the shift register 7.

The tone pattern discriminating unit 8 obtains the output (100001) of the more significant 6 bits provided that the least significant bit of the shift register 7 becomes "1". Since the address "100001" is larger than the address "100000", the tone pattern discriminating unit 8 outputs a threshold voltage value slightly larger than the reference threshold voltage (at first, an initial value of the threshold voltage value) which has already been stored at the address "100001". An output signal of the tone pattern discriminating unit 8 after being converted into a voltage through the D/A converter 6, sets a reference threshold voltage to the first comparator 1 and the second comparator 2 through the inverse amplifier 4 and the amplifier 5. As a result, the threshold voltage of the binary-coding section 10 is changed to the threshold voltage slightly larger than the reference threshold voltage (at first, the initial value of the threshold voltage) which has already been stored, a state where a low peak shown in FIG. 3a is detected as a value "1" is suppressed, to thereby improve the possibility of correct binary coding (100000100000100 . . . ). In this way, since the read signal of the record density ID is repeatedly inputted to the shift register 7 several times even after the threshold voltage has been changed, an attempt to set the threshold voltage is conducted several times so that the threshold value is set to an optimum value.

Figure 4A:
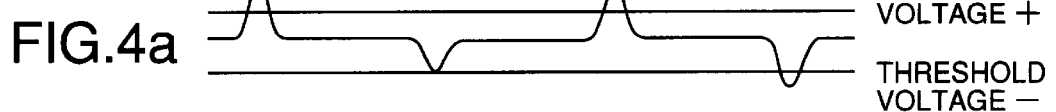
Figure 4B:
Figure 5A:
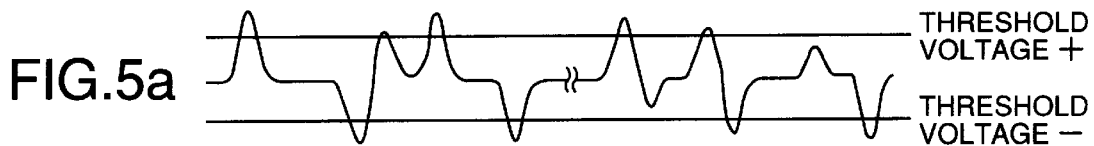
FIG. 5a shows an analog read signal.
Figure 5B:
FIG. 5b shows a conventional correct binary-coded signal.
Figure 5C:
FIG. 5c shows a conventional incorrect binary coded signal.

Also, when a record signal of a record density ID shown in FIG. 4a is inputted to the first comparator 1 and the second comparator 2, a binary-coded signal (1000000000001000 . . . ) shown in FIG. 4b is outputted from the OR circuit 3 in relation to the reference threshold voltage shown in FIG. 4a. Hence, "0000001" is first stored in the respective bits of the shift register 7.

The tone pattern discriminating unit 8 obtains the output (000000) of the more significant 6 bits provided that the least significant bit of the shift register 7 becomes "1", and outputs a threshold voltage value slightly smaller than the reference voltage value stored at the address "000000". An output signal of the tone pattern discriminating unit 8 after being converted into a voltage through the D/A converter 6, sets a reference threshold voltage to the first comparator 1 and the second comparator 2 through the inverse amplifier 4 and the amplifier 5. As a result, since the threshold voltage of the binary-coding section 10 is set to the threshold voltage slightly smaller than the reference threshold voltage, a state where a low peak shown in FIG. 4a is detected as a value "0" is suppressed, to thereby improve the possibility of correct binary coding (100000100000100 . . . ). In this way, since the read signal of the record density ID is repeatedly inputted to the shift register 7 several times even after the threshold voltage has been changed, an attempt to set the threshold voltage is conducted several times so that the threshold value is set to an optimum value.

Figure 7:
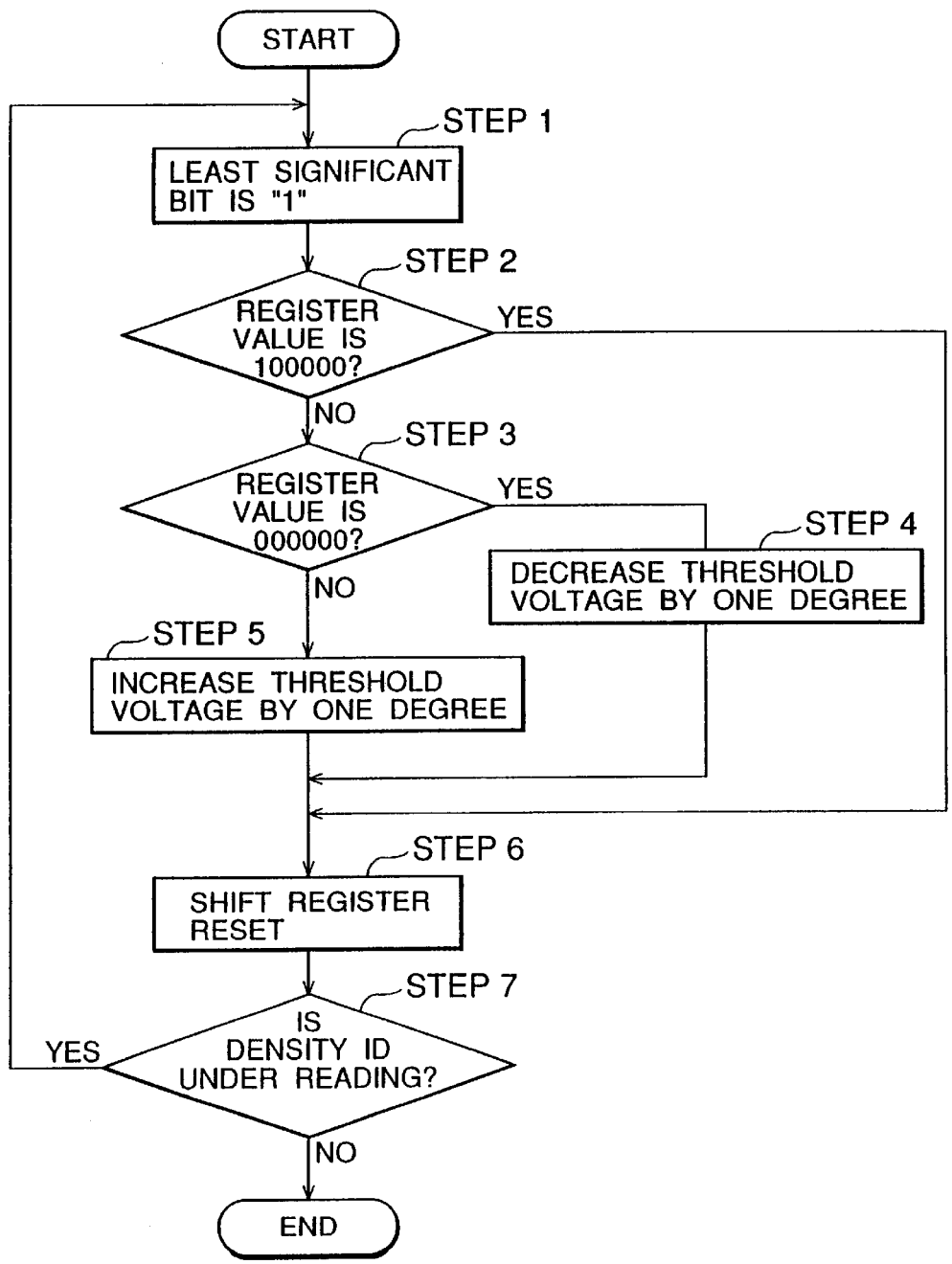
FIG. 7 is a flowchart showing a threshold voltage setting process.

A flow chart of a threshold voltage setting process which is conducted during read operation through the density ID is shown in FIG. 7. Provided that the least significant bit of the shift register 7 becomes "1" (step 1), the tone pattern discriminating unit 8 decodes a value of the shift register 7.

Figure 6A:
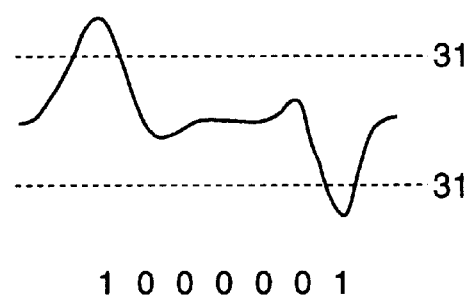

First, it is judged whether a value of the more significant 6 bits of the shift register 7 is "100000", or not (step 2). Since read operation can be performed without any errors when the value of the shift register 7 is "100000" as shown in FIG. 6a, no threshold value is changed. In the case where the value is other than "100000", it is judged whether the value of the shift register 7 is. "000000", or not (step 3). It should be noted that in the present specification, the amplitude of the threshold voltage 31 is considered as its absolute value if no particular notice is given. It is assumed that two threshold voltages 31 in FIGS. 6a, 6b, 6c and 6d are equal in absolute value to each other, and the middle position of those two threshold voltages 31 is set to a 0-level line.

Figure 6B:
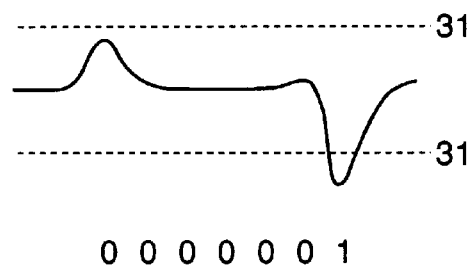
Figure 6C:
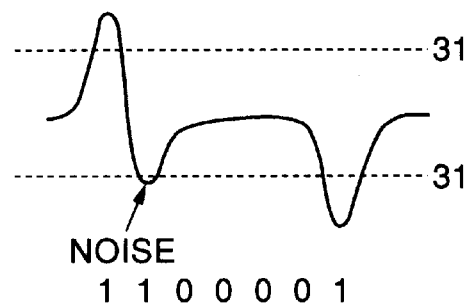
Figure 6D:
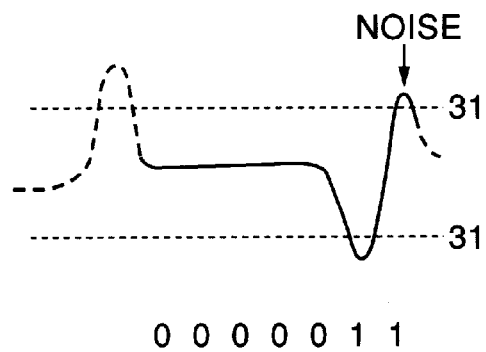

As shown in FIG. 6b, when the value is "000000", since a peak value of a waveform does not reach the threshold voltage 31 because of a large threshold voltage 31, the threshold voltage 31 is decreased by one degree (step 4). When the value is other than "000000" (FIGS. 6C and 6D), since a noise is caught because the threshold voltage 31 is smaller than a peak value of the noise, the threshold voltage 31 is increased by one degree (step 5). In this example, an increase or a decrease of the threshold voltage 31 by one degree is performed by adding or subtracting a predetermined value with respect to the threshold voltage 31 which has already been set. The predetermined value may be a value depending on the threshold voltage which is set at that time.

Thereafter, the shift register 7 is reset (step 6), and it is judged whether it is now under reading of the density ID (step 7). If it is under reading of the density ID, control returns to step 1, and the above operations are repeated. With the completion of reading the density ID, the setting process of the threshold voltage 31 is completed.

In the above embodiment, the tone pattern discriminating unit is made up of a ROM, however, it is possible to reallize this invention by the provision of a means for judging whether or not the record density ID of the magnetic tape is correctly binary-coded by the binary-coding section, and a means for outputting threshold voltage value larger or smaller than the reference threshold voltage value which has already been stored when the record density ID is incorrectly binary-coded.

Since the binary-coding device of the present invention is structured and functions as described above, the threshold voltage setting section 20 increases or decreases the threshold voltage of the binary-coding section by a predetermined amount with respect to the reference threshold voltage which has already been stored when the record density ID of the magnetic tape is incorrectly binary-coded by the binary-coding section. As a result, the threshold voltage of the binary-coding section is set according to the characteristic of the read head and the magnetic tape medium, thereby being capable of suppressing the influence of the recording characteristic of the read head and the magnetic tape medium to correctly read general data recorded in a post stage of the magnetic tape.

Also, when the threshold voltage is set according to the number of a value "0" or "1" of the binary-coded record density ID, the setting of the appropriate threshold voltage can be performed with ease and high accuracy. Furthermore, when the threshold voltage setting section 20 includes the shift register that stores the binary-coded record density ID and the non-volatile memory that outputs a threshold voltage value corresponding to an output of the shift register, the threshold voltage setting section 20 high in processing speed can be constituted by the combination of relatively simple parts. Thus, the present invention can provide a device for binary-coding a read signal from a magnetic tape which is superior to the conventional device.

While this invention has been described with reference to illustrative embodiments, this description is not intended to be construed in a limiting sense. Various modifications of the illustrative embodiments, as well as other embodiments of the invention, will be apparent to persons skilled in the art upon reference to this description. It is, therefore, contemplated that the appended claims will cover any such modifications or embodiments as fall within the true scope of the invention.

What is claimed is:

1. A device for binary-coding a read signal from a magnetic tape, comprising:

a binary-coding section which outputs a value "1" when an analog read signal exceeds a predetermined threshold voltage, and outputs a value "0" when said analog read signal does not exceed the predetermined threshold voltage; and a threshold voltage setting section which increases or decreases the threshold voltage of said binary-coding section by a predetermined amount with respect to a reference voltage when a record density ID recorded in a head of the magnetic tape is incorrectly binary-coded by said binary-coding section;

wherein said threshold voltage setting section increases the threshold voltage of said binary-coding section by the predetermined amount with respect to the reference voltage when the magnetic recording density ID binary-coded by said binary-coding section is incorrect because the number of bits of the value "1" is large, and decreases the threshold voltage of said binary-coding section by the predetermined amount with respect to the reference voltage when the magnetic recording density ID binary-coded by said binary-coding section is incorrect because the number of bits of the value "0" is large.

2. A device for binary-coding a read signal from a magnetic tape, comprising:

a binary-coding section which outputs a value "1" when an analog read signal exceeds a predetermined threshold voltage, and outputs a value "0" when said analog read signal does not exceed the predetermined threshold voltage; and a threshold voltage setting section which increases or decreases the threshold voltage of said binary-coding section by a predetermined amount with respect to a reference voltage when a record density ID recorded in a head of the magnetic tape is incorrectly binary-coded by said binary-coding section;

wherein said threshold voltage setting section comprises,
a parallel-output type shift register for storing the recording density ID of the magnetic tape which has been binary-coded by said binary-coding section; and
a nonvolatile memory for setting a corresponding threshold voltage value to said binary-coding section according to an output of said shift register.

3. A device for binary-coding a read signal from a magnetic tape as claimed in claim 2, wherein said binary-coding section comprises:

a first comparator having a positive input to which said analog read signal is supplied;

a second comparator having a negative input to which said analog read signal is supplied; and an OR circuit which inputs an output of said first comparator and an output of said second comparator to output a signal to said threshold voltage setting section.

4. A device for binary-coding a read signal from a magnetic tape as claimed in claim 3, wherein said threshold voltage setting section comprises:

a parallel-output type shift register for storing the recording density ID of the magnetic tape which has been binary-coded by said binary-coding section;

a nonvolatile memory for storing a digital output corresponding to a threshold voltage value according to an output of said shift register; a D/A converter for converting the digital output into an analog value;

an inverse amplifier having a negative input to which an output of said D/A converter is connected and a positive input which is grounded; and an amplifier having a positive input to which an output of said D/A converter is connected and a negative input which is grounded, wherein an output of said inverse amplifier is connected to a positive input of said second comparator, and an output of said amplifier is connected to a negative input of said first comparator.

5. A method of setting a threshold voltage in a device for binary coding of a read signal from a magnetic tape, said method comprising:

reading a record density ID of said read signal into a storage device;

determining whether said record density ID is incorrectly coded; and adjusting the threshold voltage by a predetermined amount if said record density ID is incorrectly coded, wherein said step of determining whether said record density ID is incorrectly coded further comprised,
determining whether a least significant bit of said record density ID is "1";
determining whether a most significant six bits of said record density ID is "100000" and, if so, skipping said step of adjusting said threshold voltage; and wherein said step of adjusting said threshold voltage further comprises,
determining whether said most significant six bits of said record density ID is "000000";
decreasing the threshold voltage by a predetermined amount if said most significant six bits of said record density ID is "000000"; and
increasing the threshold voltage by the predetermined amount if said most significant six bits of said record density ID is not "000000".

* * * * *